United States Patent
Wilcox et al.

(10) Patent No.: US 11,894,496 B2
(45) Date of Patent: Feb. 6, 2024

(54) SOLID-STATE LIGHT EMITTING DEVICE WITH IMPROVED COLOR EMISSION

(71) Applicant: CreeLED, Inc., Durham, NC (US)

(72) Inventors: Robert Wilcox, Rolesville, NC (US); Sarah Trinkle, Todd, NC (US); Derek Miller, Raleigh, NC (US); Peter Andrews, Durham, NC (US); Colin Blakely, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 143 days.

(21) Appl. No.: 17/178,511

(22) Filed: Feb. 18, 2021

(65) Prior Publication Data
US 2022/0262989 A1 Aug. 18, 2022

(51) Int. Cl.
H01L 33/50 (2010.01)
H01L 33/48 (2010.01)
H01L 33/58 (2010.01)
H01L 33/60 (2010.01)

(52) U.S. Cl.
CPC .......... *H01L 33/505* (2013.01); *H01L 33/486* (2013.01); *H01L 33/58* (2013.01); *H01L 33/60* (2013.01)

(58) Field of Classification Search
None
See application file for complete search history.

(56) References Cited

U.S. PATENT DOCUMENTS

| | | |
|---|---|---|
| 8,525,190 B2 | 9/2013 | Donofrio et al. |
| 2015/0102373 A1* | 4/2015 | Lee .................... H01L 33/0095 438/27 |
| 2015/0171291 A1 | 6/2015 | Huang et al. |
| 2017/0194538 A1 | 7/2017 | Chen et al. |
| 2017/0229621 A1 | 8/2017 | Chen et al. |
| 2017/0331003 A1 | 11/2017 | Cheng et al. |
| 2018/0123001 A1 | 5/2018 | Hung et al. |
| 2018/0159004 A1 | 6/2018 | Lai et al. |

FOREIGN PATENT DOCUMENTS

EP 3483944 A1 5/2019

OTHER PUBLICATIONS

International Search Report and Written Opinion for International Patent Application No. PCT/US2022/016418, dated May 31, 2022, 19 pages.

* cited by examiner

*Primary Examiner* — Bo B Jang
(74) *Attorney, Agent, or Firm* — Withrow & Terranova, P.L.L.C.

(57) ABSTRACT

A light emitting device includes a LED having a light emitting first surface and a light emitting second surface that define a corner. A support layer is disposed to receive light emitted by the light emitting second surface and is disposed adjacent the corner. A luminophoric medium layer at least partially covers the light emitting first surface and the light emitting second surface where the luminophoric medium layer is at least partially supported by the support layer to prevent a narrowing of the luminophoric medium layer.

20 Claims, 7 Drawing Sheets

SOLID-STATE LIGHT EMITTING DEVICE WITH IMPROVED COLOR EMISSION

BACKGROUND

The present invention relates to light emitting devices and, more particularly, to solid-state light emitting devices.

Solid-state light emitting devices such as light emitting diodes ("LEDs") are used in a variety of lighting applications. LEDs generally include a series of semiconductor layers that may be epitaxially grown on a substrate such as, for example, a sapphire, silicon, silicon carbide, gallium nitride or gallium arsenide substrate. One or more semiconductor p-n junctions are formed in these epitaxial layers. When a sufficient voltage is applied across the p-n junction, electrons in the n-type semiconductor layers and holes in the p-type semiconductor layers flow toward the p-n junction. As the electrons and holes flow toward each other, some of the electrons will "collide" with corresponding holes and recombine. Each time this occurs, a photon of light is emitted, which is how LEDs generate light. The wavelength distribution of the light generated by an LED generally depends on the semiconductor materials used and the structure of the thin epitaxial layers that make up the "active region" of the device (i.e., the area where the electrons and holes recombine).

Most LEDs are nearly monochromatic light sources that appear to emit light having a single color. Thus, the spectral power distribution of the light emitted by most LEDs is centered about a "peak" wavelength, which is the wavelength where the spectral power distribution or "emission spectrum" of the LED reaches its maximum as detected by a photo-detector. In order to generate light of a specific color, in some embodiments LEDs have been provided that include several LEDs that each emit a light of a different color. The different colored light emitted by the LEDs combine to produce a desired intensity and/or color of light. For example, to produce white light, red, green and blue LEDs may be simultaneously energized such that the resulting combined light may appear white, or nearly white, depending on, for example, the relative intensities, peak wavelengths and spectral power distributions of the source red, green and blue LEDs. White light may also be produced by surrounding a LED with one or more luminescent materials such as phosphors that convert some of the light emitted by the LED to light of one or more other colors. The combination of the light emitted by the single-color LED that is not converted by the luminescent material(s) and the light of other colors that are emitted by the luminescent material(s) may produce a white or near-white light. The color of the emitted light may be other than white depending on the color of the light emitted by the LED and the type of luminescent material(s).

In general, luminescent materials may absorb light having first wavelengths and re-emit light having second wavelengths that are different from the first wavelengths. For example, "down-conversion" luminescent materials may absorb light having shorter wavelengths and re-emit light having longer wavelengths. Phosphors are the luminescent materials that are most widely used to convert a single-color (typically blue or violet) LED into a white light emitting device. However, it will be appreciated that other luminescent materials may be used that absorb light at one wavelength and re-emit light at a different wavelength in the visible spectrum.

SUMMARY

In some embodiments, a light emitting device comprises a LED having a light emitting surface defining a corner. A luminophoric medium layer at least partially covers the light emitting surface. A support layer is disposed between the light emitting surface and the luminophoric medium layer such that the support layer shapes the luminophoric medium layer at the corner to prevent a narrowing of the luminophoric medium layer at the corner.

The support layer may extend from adjacent the corner. The LED may be mounted on a supporting surface and the support layer may extend from the corner to the supporting surface. The support layer may be generally sloped toward the supporting surface. The support layer may extend from adjacent the corner and may curve or slope away from an adjacent light emitting surface of the LED. The support layer may comprise an optical gel and the optical gel may comprise silicone. The support layer may be transparent. The LED may comprise a light emitting first surface and a light emitting second surface that define the corner and the support layer may be disposed over at least one of the light emitting first surface and the light emitting second surface such that the support layer extends from adjacent the corner. An exterior surface of the support layer may have a curved shape that asymptotically approaches the first light emitting surface. The exterior surface of the support layer may be formed of a plurality of curved portions. The exterior surface of the support layer may be at least partially linear. The LED may comprise a light emitting top surface and a light emitting side surface that define the corner where the support layer extends over the light emitting side surface. The support layer may extend at least partially over the light emitting top surface. The support layer may comprise at least one of an epoxy, a plastic, sapphire, and a glass. The support layer may comprise a stand-alone component that has structural integrity. The support layer may comprise at least one of a ring and a cap that is separately mounted over the LED.

In some embodiments, a light emitting device comprises a LED having a light emitting first surface and a light emitting second surface defining a corner. A support layer is disposed to receive light emitted by the light emitting second surface and disposed adjacent the corner. The support layer has an exterior surface that non-conformally covers at least one of the light emitting first surface and the light emitting second surface. A luminophoric medium layer at least partially covers the light emitting first surface and the light emitting second surface where the luminophoric medium layer is at least partially supported by the support layer.

The support layer may comprise a gel. The support layer may terminate adjacent the corner and extend away from the LED.

DETAILED DESCRIPTION

As used herein, the term "solid-state light emitting device" refers to a light emitting device that includes at least one LED. The solid-state light emitting devices according to embodiments of the present invention may be provided, as individual lighting devices, as subcomponents of the individual lighting devices or, for example, as part of lamps, bulbs and/or light fixtures.

Solid-state light emitting devices according to embodiments of the invention may include, but are not limited to, III-V nitride (e.g., gallium nitride) based LEDs fabricated on a silicon carbide, sapphire or gallium nitride substrates such as various devices manufactured and/or sold by Cree, Inc. of Durham, N.C. Such LEDs may (or may not) be configured to operate such that light emission occurs through the growth substrate (or a semiconductor layer that was near the growth substrate if the growth substrate is removed) in a so-called "flip chip" orientation. Solid-state light emitting devices according to embodiments of the present invention include both vertical devices with a cathode contact on one side of the LED, and an anode contact on an opposite side of the LED and devices in which both contacts are on the same side of the device. The design and fabrication of solid-state light emitting devices are well known to those skilled in the art, and hence further description thereof will be omitted.

In some embodiments, the solid-state light emitting devices may include one or more LEDs and a luminophoric medium that includes at least one luminescent material that operates to emit light having a peak wavelength in a desired color range such as white. In other embodiments the luminophoric medium may include multiple luminescent materials that emit light having peak wavelengths in multiple color ranges. The multiple luminescent materials may be arranged in layers. The luminophoric medium may include a one or more luminescent materials, such as phosphors, that are suspended, for example, in one or more binder layers. The term "luminophoric medium layer" as used herein means a layer that includes a luminescent material that functions to convert radiation emitted by an LED to radiation having a peak wavelength in a desired color range.

Figure 1:
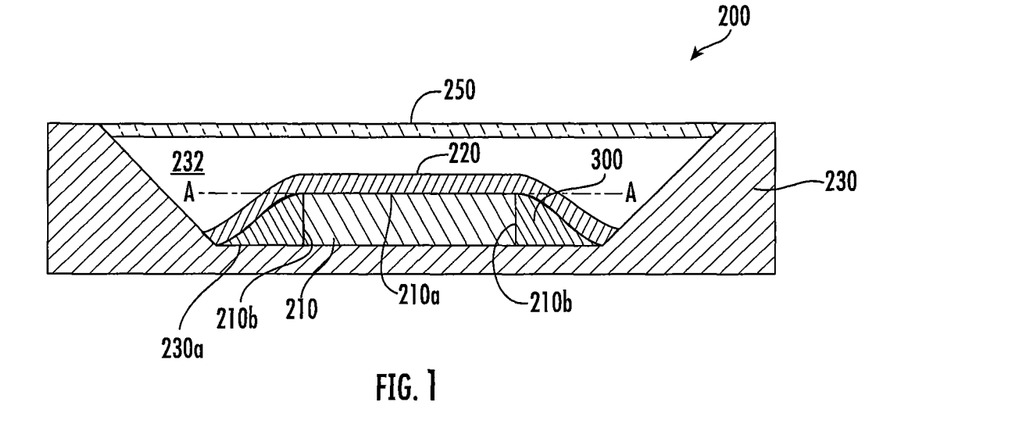
FIG. 1 is a section view of an embodiment of a solid-state light emitting device.
Figure 2:
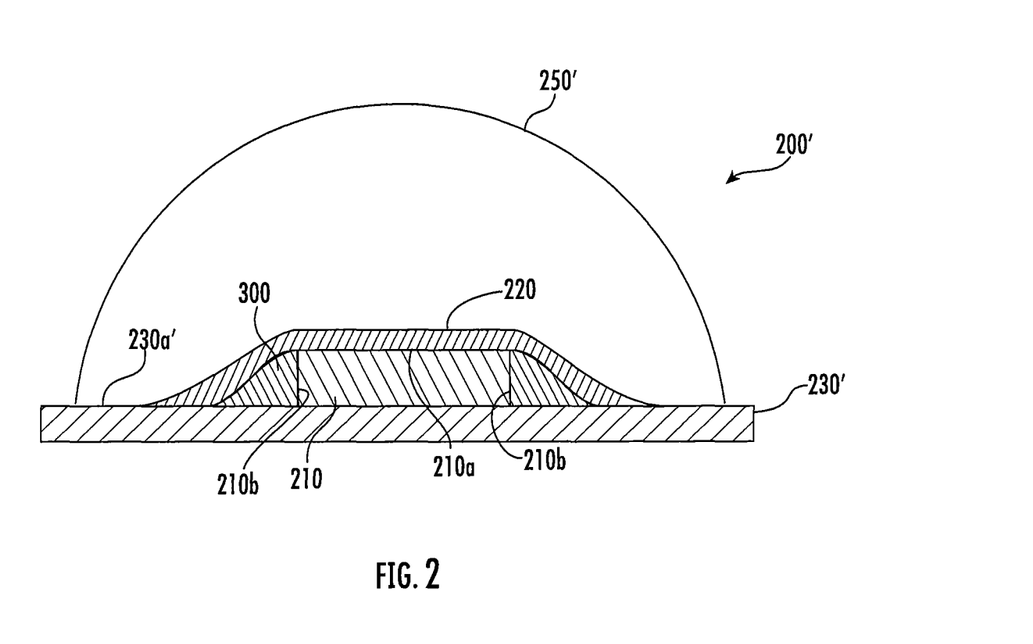
FIG. 2 is a section view of another embodiment of a solid-state light emitting device.

FIGS. 1 and 2 are cross-sectional diagrams illustrating example solid-state light emitting devices according to embodiments of the present invention that include luminophoric mediums. FIG. 1 illustrates a first solid-state light emitting device 200 that includes an LED 210 and a luminophoric medium layer 220. The LED 210 may be a blue LED, although violet, ultraviolet or other color LEDs could be used. The LED 210 may have many different semiconductor layers arranged in different ways. LED structures and their fabrication and operation are generally known in the art and hence are only briefly discussed herein. The layers of the LED 210 can be fabricated using known processes. Typically, LEDs are grown on a growth substrate such as, for example, a sapphire, silicon carbide, aluminum nitride (AlN), or gallium nitride (GaN) substrate to provide a grown semiconductor wafer, and this wafer is then singulated into individual LED dies such as LED 210. The growth substrate can remain as part of the final singulated LED or, alternatively, the growth substrate can be fully or partially removed. In embodiments where the growth substrate remains, it can be shaped and/or textured to enhance light extraction. The solid-state light emitting devices as described herein have particular use with LEDs that have a light emitting surface that emits light from different sides that are in different planes and, more particularly, with LEDs that have light emitting sides that meet at a corner. For example, LED 210 has a light emitting surface that emits light from a first plane A-A (FIG. 1) defined by the top side surface 210a and four additional planes B-B (FIG. 4) defined by side surfaces 210b. An example of such an LED is the XPE LED sold by CREE INC. of Durham, NC.

The LED 210 may be mounted on a body 230. The body 230 may physically support the LED 210, the luminophoric medium layer 220 and/or a lens 250. The body 230 may comprise any suitable material or combinations of materials such as resins, ceramics, aluminum, glass, plastic or the like. The body 230 may comprise a cavity 232 for receiving the LED 210 and luminophoric medium layer 220 and may be made of or covered in a reflective material for reflecting light emitted by the LED 210. In the embodiment of the solid-state light emitting device of FIG. 1, the body 230 comprises a reflective cup where the LED 210 is supported on supporting surface 230a in the cavity 232. The LED 210 is electrically coupled to electrical leads for delivering critical current to the LED 210. In some embodiments, the body 230 may support or include additional layers or components such as components for delivering current to the LEDs such as a PCB, lead fame structure or the like where the LED 210 may be physically and electrically coupled to such structures. The body 230 may include additional layers or components that may function as a heat sink for dissipating heat from the LED 210. It is to be understood that the body 230, LED 210 and associated components and structures may have a wide variety of configurations in addition to those as specifically described herein as is known in the art. The body 230 and associated components and structures may be formed of many different materials such as, for example, aluminum oxide, aluminum nitride, organic insulators, a printed circuit board (PCB), sapphire, silicon or combinations of such materials. LED 210 is typically fixed in place with a conductive glue or solder (not shown) and may be mounted on an electrically conductive element or elements for delivering current to the LED 210. In the embodiment of the solid-state light emitting device 200' of FIG. 2, the body 230' comprises a flat substrate where the LED 210 is positioned on the supporting surface 230a' of the substrate 230'. As previously described, in some embodiments, the body 230' may support or include additional layers or components such as components for delivering current to the LEDs such as a PCB, lead fame structure or the like where the LED 210 may be physically and electrically coupled to such structures. The body 230' may also include additional layers or components and may function as a heat sink for dissipating heat from the LED 210. It is to be understood that the body 230', LED 210 and associated components and structures may have as wide variety of configurations in addition to those as specifically described herein as is known in the art. Moreover, while the devices shown and described herein have a single LED 210, a plurality of LEDs 210 may be mounted on a support structure in a single solid-state light emitting device.

A hard, transparent optical element or lens 250, 250' may be arranged to enclose the LED 210 and the luminophoric medium layer 220 and provides environmental and/or mechanical protection therefore. The lens 250, 250' can be many different shapes such as, but not limited to flat (FIG. 1) or hemispheric (FIG. 2). Many different materials can be used for the lens 250 such as sapphire, glass or silicone. In some embodiments, the lens 250 may comprise a luminophoric medium and/or may be used to hold a luminophoric medium in place over the LED 210 in addition to the luminophoric medium layer 220 that is directly coated on the LED 210. While two example embodiments of a solid-state light emitting device are shown in FIGS. 1 and 2, the light emitting device 200, 200' may have a variety of configurations. Moreover, the LEDs 210 and solid-state light emitting devices 200, 200' may comprise any suitable devices in addition to those as specifically described herein.

A relatively thin luminophoric medium layer 220 may be applied over the LED 210 to receive light emitted by the LED 210 as shown in FIGS. 1 and 2. The color of light emitted by the LED 210 and the luminescent material in the luminophoric medium layer 220 together combine to emit light at a desired color peak range. The luminophoric medium layer 220 includes a luminescent material that converts radiation emitted by the LED 210 to radiation having a peak wavelength in a desired color range. The combination of the light emitted by the single-color LED that is not converted by the luminescent material(s) and the light of other colors that are emitted by the luminescent material(s) may produce a white or near-white light. The color of the emitted light may be other than white depending on the color of the light emitted by the LED and the type of luminescent material(s). The color of the light emitted by the luminescent material is dependent in part on the interaction between the luminescent materials and the light emitted by the LED. Generally, the more luminescent material that the light interacts with the greater the color conversion of the light. Thus, light passing through a relatively thicker layer of luminescent material will undergo a greater color conversion than light passing through a relatively thinner layer of material. As shown in FIGS. 1 and 2, the luminophoric medium layer 220 covers the side surfaces 210b and top surface 210a and is arranged to receive light emitted by the side surfaces 210b and top surface 210a of the LED 210.

Figure 3:
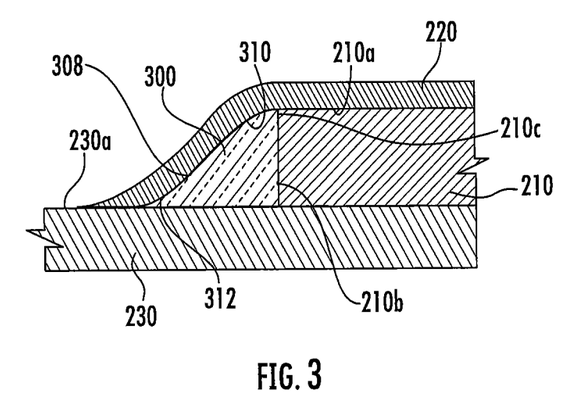
FIG. 3 is a detailed section view of a subcomponent of the light emitting devices of FIGS. 1 and 2 showing the support layer in greater detail.

While complete light emitting devices have been described with respect to FIGS. 1 and 2, the arrangement of the LED 210, luminophoric medium layer 220 and support layer 300 may be provided as a subcomponent such as shown in FIG. 3 rather than as a complete light emitting device. The subcomponent may include a support substrate that defines supporting surface 230a and that supports the LED 210, luminophoric medium layer 220 and support layer 300. The subcomponent may be used as a component in a solid-state light emitting device.

It will be appreciated that the solid-state light emitting devices shown in FIGS. 1 and 2 are not intended to be limiting. For example, while the luminophoric medium layers 220 depicted in FIGS. 1 and 2 are shown as comprising a single-layer luminophoric medium, it will be appreciated that multiple-layer luminophoric mediums may be used in which multiple phosphors (or other luminescent materials) are mixed within the same layer or coating. Additionally, in other embodiments various luminescent materials may be mixed in one or more layers of a multi-layer luminophoric medium. In one example embodiment, a solid-state light emitting device may be provided that includes one or more LEDs (e.g., blue LEDs that emit light having a peak wavelength between 440 and 470 nanometers) and a luminophoric medium that includes a yellow luminescent material such as yellow phosphor that together emit light having a peak wavelength in the white color range.

The luminophoric medium layer 220 may comprise an encapsulant material such as, for example, silicone that has luminescent materials suspended therein. In the embodiments of FIGS. 1 and 2, the luminophoric medium layer 220 is coated on the top surface 210a and the support layer 300 so as to cover top surface 210a and side surfaces 210b and to receive light emitted by the side surfaces 210b and top surface 210a of the LED 210. It will also be appreciated that other configurations may be made to the solid-state light emitting devices of FIGS. 1 and 2. For example, in some embodiments, one or more of the layers of the luminophoric medium layer 220 may not cover the entire top surface 210a or side surfaces 210b of the LEDs 210.

The luminophoric medium layer 220 may be coated on the LEDs 210 using many different methods. For example, in some embodiments, the luminophoric medium layer 220 may be applied to semiconductor LED wafers during the LED manufacturing process. In still other embodiments, the luminophoric medium layer 220 may be sprayed or otherwise applied to the LED 210 after the LED 210 has been singulated and mounted on the mounting substrate 230, 230'. Numerous other techniques are known in the art and are suitable for applying the luminophoric mediums according to embodiments of the present invention.

The inventors of the present invention have found that coating a LED 210 with a conformal luminophoric medium layer 220 may create color uniformity issues. A conformal luminophoric medium layer 220 is typically thinner at the corners 210c, 210d of the LED 210 than it is over the flat surfaces of the LED 210, such as the top surface 210a and side surfaces 210b. It has been found that light emitted by the LED 210 that travels through the luminophoric medium layer 220 at the corners 210c, 210d of the LED 210 may pass through less luminescent material than the light emitted by the LED 210 that travels through the luminophoric medium on the flat side surfaces 210b and top surface 210a of the LED 210. As a result, the luminescent material that converts radiation emitted by the LED 210 may have less of an effect on the light emitted at or near the corners 210c, 210d than it does on light emitted at the top surface 210a and side surfaces 210b. The result is that the emitted light has a first peak wavelength in a desired color range and a "halo" of light in a second peak wavelength in a color range other than the desired color range. For example, in one typical application, where a blue LED is used with a yellow phosphor as the luminescent material to create light with a peak wavelength in the white color range, the resulting emitted light may be a predominantly white light having a thin bluish halo located therein. The effect is similar for other colors of emitted light. The color uniformity of the emitted light may be improved by using a support layer 300 as described herein.

Figure 4:
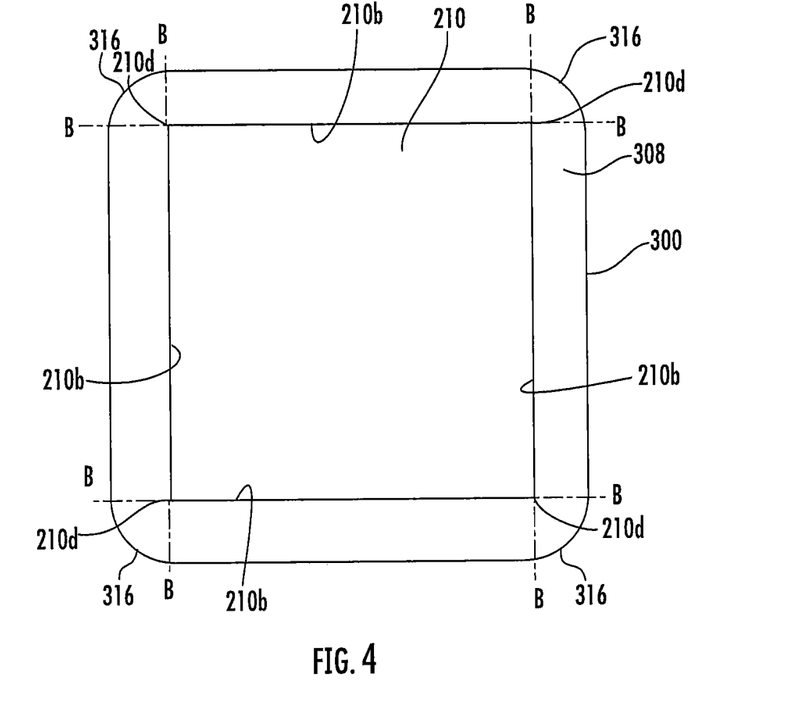
FIG. 4 is a top view of the LED and support layer of FIG. 3.
Figure 5:
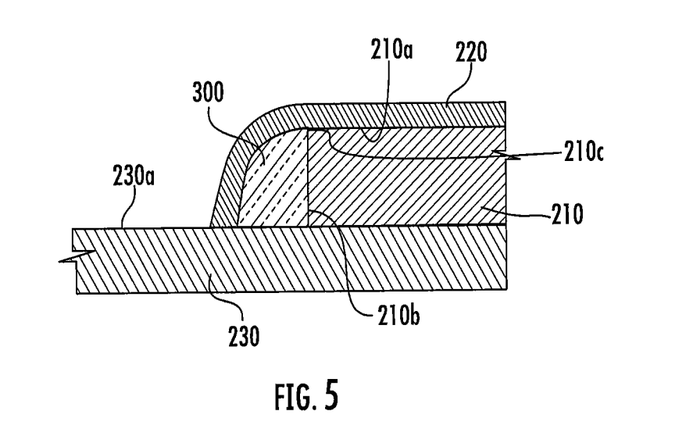
FIG. 5 is a detailed section view similar to FIG. 3 showing an alternate arrangement of the support layer.

FIG. 3 is a detailed view of a portion of a subcomponent comprising LED 210, luminophoric medium layer 220, support layer 300 and supporting substrate 230 used in the light emitting devices disclosed herein. FIG. 4 is a top view showing the LED 210 and support layer 300. It will be appreciated that the various components and layers as described herein are not drawn to scale in the figures in order to better illustrate the features in detail. Moreover, while the illustrated LED 210 is shown as substantially rectangular in the figures, the support layer 300 as described herein may be used with any LED that would benefit from the use of the support layer 300 and has particular applicability with LEDs that emit light from light emitting surfaces that are disposed in more than one plane.

In one embodiment, the support layer 300 may comprise a gel layer of a transparent or clear optical material such as silicone as shown in FIGS. 3 and 4. The support layer 300 is disposed around the side surfaces 210b of the LED 210 such that the exterior surface 308 of the support layer 300 extends from near adjacent the light emitting top surface 210a of the LED to the supporting surface 230a of the supporting substrate 230 on which the LED 210 is mounted and covers the light emitting side surfaces 210b. The support layer 300 is formed to create a smooth transition in the luminophoric medium layer 220 as it transitions from top surface 210a to the side surfaces 210b of the LED 210. Using the support layer 300, the luminophoric medium layer 220 does not extend directly over the relatively sharp transition or corner 210c between the top surface 210a and the side surfaces 210b of the LED 210 where the luminophoric medium layer 220 can become thinned. The support layer 300 may be in direct contact with the side surfaces 210b of the LED 210 such that no air gap is formed between the side surfaces 210b and the support layer 300. Likewise, the luminophoric medium layer 220 maybe directly contact the support 230 such that no air gap is formed between the luminophoric medium layer 220 and the support 230.

The exterior surface 308 of the support layer 300 may have a curved shape that asymptotically approaches the top surface 210a of the LED 210 and the supporting surface 230a and may be formed without sharp corners or transitions such that the support layer 300 has a smooth exterior surface 308. It is to be understood that the term "asymptotically" is not used herein to describe the shape of the support layer 300 in strict mathematical terms but rather to describe the gradual sloping or curving away of the exterior surface 308 of the support layer 300 from the top surface 210a of the LED 210 by curved transition 310. The exterior surface 308 of the support layer 300 also gradually slopes or curves to supporting surface 302a by curved transition 312. The gradual curving or sloping away of the exterior surface 308 of the support layer 300 from the light emitting top surface 210a of the LED 210 prevents a sharp corner from being created in the luminophoric medium layer 220 that would adversely thin the luminophoric medium layer 220. In this manner, the support layer 300 and the luminophoric medium layer 220 do not form a conformal layer on the LED 210, where a conformal layer is a layer that follows the contours of, and extends parallel to, the surfaces of the LED. The support layer 300 and the luminophoric medium layer 220 are non-conformal layers in that the exterior surface 308 of the support layer 300 and the luminophoric medium layer 220 supported on the support layer 300 do not follow the contours of, and do not extend parallel to, the surfaces of the LED 210. Rather the non-conformal layers of the support layer 300 and the luminophoric medium layer 220 gradually extend towards and/or away from the surfaces of the LED 210 in order to eliminate the sharp transitions or corners created at the intersection of the light emitting surfaces of the LED 210.

FIG. 4 shows the corners 210d between the side surfaces 210b of LED 210. The support layer 300 is applied around the corners 210d such that the exterior surface 308 of the support layer 300 has a rounded, gradual curved transition areas 316 around the corners 210d rather than the sharp transitions of corners 210d. Thus, the thinned areas of the luminophoric medium layer 220 may be eliminated at corners 210d by providing the smooth transition areas 316 in the exterior surface 308 of the support layer 300 as shown in FIG. 4.

Figure 6:
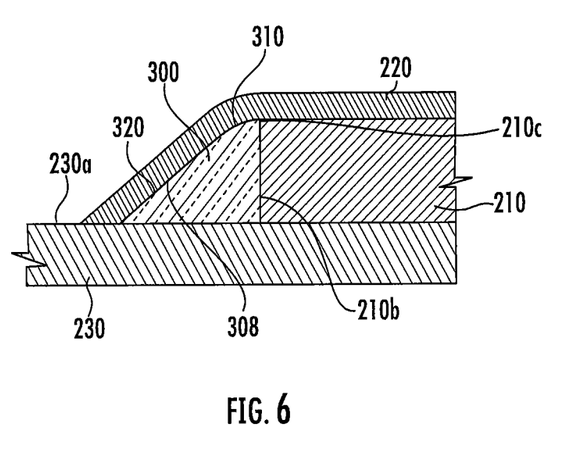
FIG. 6 is a detailed section view similar to FIG. 3 showing another alternate arrangement of the support layer.
Figure 7:
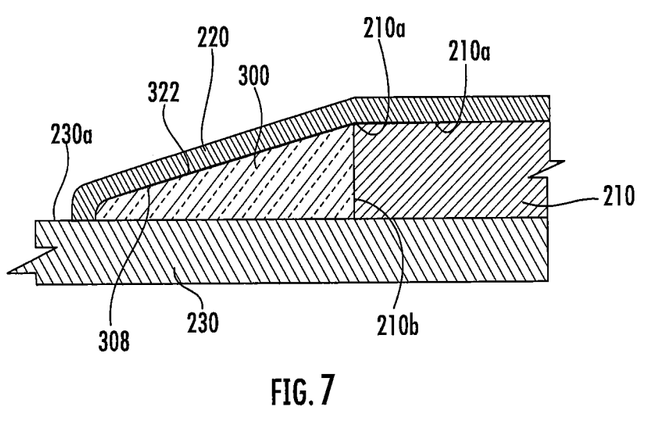
FIG. 7 is a detailed section view similar to FIG. 3 showing yet another alternate arrangement of the support layer.

While the exterior surface 308 of the support layer 300 is shown in cross-section in FIG. 4 as being formed generally of two oppositely curved surfaces 310, 312, the exterior surface 308 of the support layer 300 may have a variety of shapes provided that the support layer 300 eliminates sharp transitions or corners in the luminophoric medium layer 220. For example, as shown in FIG. 6, the exterior surface 308 of the support layer 300 may gradually curve away from the top surface 210a of the LED 210 at curved transition 310 but have a linear portion 320 between the curved transition 310 and the supporting surface 230a. In other embodiments, the exterior surface 308 of the support layer 300 may be formed by a combination of a plurality of linear and curved portions. Because the support layer 300 may be formed by a gel, the shape of the exterior surface 308 may not be strictly controlled and the exterior surface 308 may have various curved portions and/or straight portions other than as specifically described herein Any shape of the support layer 300 may be used provided that the support layer 300 eliminates the sharp corners or transition areas and the resultant thinned areas in the luminophoric medium as explained above. Moreover, the support layer 300 may have different relative dimensions as compared to the LED 210 where the support layer 300 may extend laterally from the LED 210 a relatively greater or lesser distance than as shown in the figures. In this regard, the support layer 300 may be formed with a flat linear exterior surface 308 rather than the curved surfaces discussed above as shown in FIG. 7. In the embodiment of FIG. 7, the smooth transition at the corner 210a of the LED 210 is provided using a flat exterior portion 322 on the exterior surface 308 of the support layer 300 by decreasing the slope of the exterior portion 322 of the support layer 300 to a point where a sharp transition in the luminophoric medium layer 220 is eliminated. Thus, the shape of the exterior surface 308 of the support layer 300 may have a variety of shapes provided that the sharp transitions of, and corresponding thinning in, the luminophoric medium layer 220 is eliminated.

Figure 8:
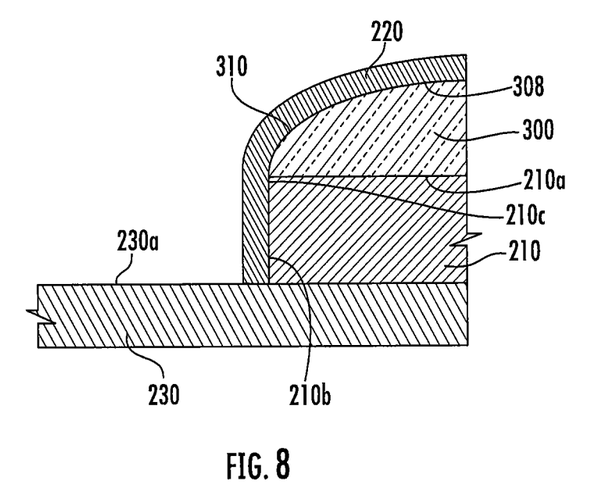
FIG. 8 is a detailed section view similar to FIG. 3 showing still another alternate arrangement of the support layer.

Referring to FIG. 8, in some embodiments, the support layer 300 may extend over the top surface 210a of the LED 210 provided that the support layer 300 is shaped as described above to eliminate sharp transitions at the corners 210c of the LED 210. The support layer 300 may have a curved shape that gradually or asymptotically approaches the plane B-B of the light emitting side surfaces 210b of the LED 210. The exterior surface 308 of support layer 300 gradually slopes or curves away from the side surfaces 210b of the LED 210 by curved transition 310. The gradual curving or sloping away of the exterior surface 308 of the support layer 300 from the light emitting side surfaces 210b prevents a sharp corner from being created in the luminophoric medium layer 220 that would adversely thin the luminophoric medium layer 220. The support layer 300 as shown in FIG. 8 can be achieved using a surface tension application process which may use an upside-down or inverted cure method in conjunction with surface tension balance to achieve the rounded bubble configuration of the support layer 300 on the top of the LED 210.

Figure 9:
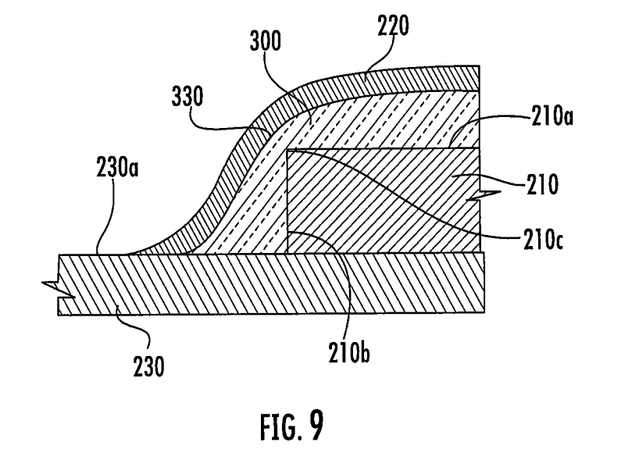
FIG. 9 is a detailed section view similar to FIG. 3 showing another alternate arrangement of the support layer.
Figures 10, 11:
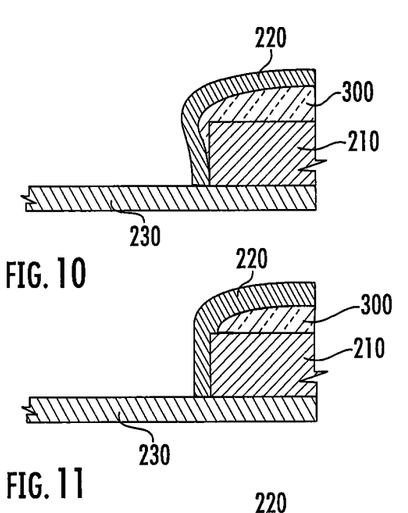
FIGS. 10 through 13 are detailed section views similar to FIG. 3 showing modifications in the arrangement of the support layer.
Figures 12, 13:
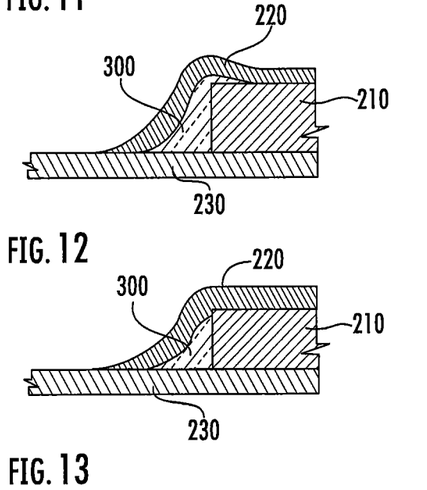

Moreover, the support layer 300 may extend over both the top surface 210a and the side surfaces 210b as shown in FIG. 9 to create smooth transitions 330 over the corners 210c, 210d. The support layer 300 may also extend slightly above or below the top ends of side surfaces 210b of the LED 210 as shown in FIGS. 10 and 12 or slightly below the top ends of side surfaces 210*b* of the LED 210 as shown in FIGS. 11 and 13 provided that a sharp transition in the luminophoric medium layer 220 is eliminated. When the exterior surface 308 of the support layer 300 is described as being adjacent to or at a surface, it is to be understood that the exterior surface may extend slightly above or below the surface and does not have to be exactly at the surface provided that the thinning of the luminophoric medium layer 220 is not thinned in that area.

The support layer 300 may be made of a transparent optical gel such as silicone or other optical gel. The gel may be curable or non-curable and may be applied using any suitable deposition technique. In addition to gels, the support layer 300 may be formed of transparent epoxies, plastics, or the like.

Figure 14:
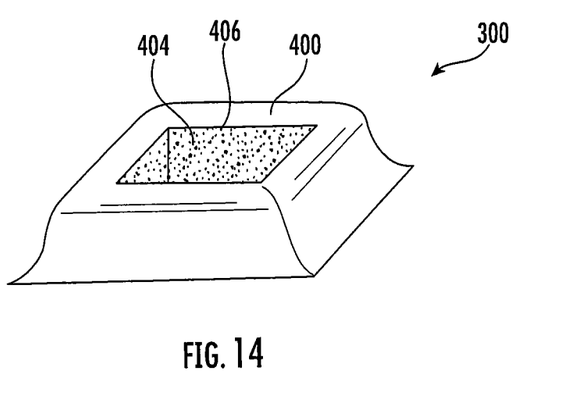
FIGS. 14 and 15 are perspective views of different embodiments of stand-alone support layers having structural integrity.
Figure 15:
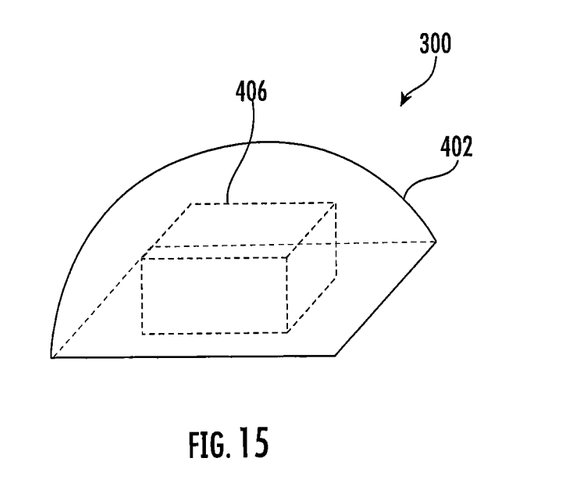

The support layer 300 may also comprise a stand-alone component that has structural integrity apart from the LED 210 and supporting substrate as opposed to being applied as a soft gel or epoxy. The devices shown in FIGS. 14 and 15 are separate stand-alone components that have independent structural integrity. The support layers 300 shown in FIGS. 14 and 15 may be rigid and may be formed of, for example, a hard material such as glass, sapphire or hard plastic or the support layers 300 may be somewhat pliable and formed of a softer material such as molded silicone. For example, the support layer 300 may be provided as a ring 400 (FIG. 14) or cap 402 (FIG. 15) that is separately mounted on the supporting substrate and/or LED such that it shapes the luminophoric medium layer 220 in the same manner as previously described. The ring 400 may cover the side surfaces 210*b* of the LED 210 leaving the top surface 210*a* uncovered while the cap 402 may cover all of the side surfaces 210*b* and top surface 210*a* or only the top surface as described with respect to FIG. 8. The stand-alone support layer may be shaped as previously described. An aperture 406 may be provided in the ring 400 or cap 402 for receiving the LED 210 (not shown). A gel interface 404 may be provided in the aperture 406 between the LED 210 and support layer 300 to eliminate losses at the interface between the LED 210 and the support layer 300. While the stand-alone support layers may be formed as one piece as shown in FIGS. 14 and 15, these support members may also be formed of plural pieces that together form the support layer in the assembled device.

The support layer 300 has been described above as comprising a transparent material such that the support layer 300 does not affect the optical performance of the LED 210 and luminophoric medium layer 220; however, in some embodiments the support layer 300 may be provide with optical properties and may not be completely transparent provided that the support layer 300 eliminates the sharp transitions and corresponding thinning in the luminophoric medium layer. For example, the support layer 300 may have slightly diffusive or light scattering properties.

The present invention has been described above with reference to the accompanying drawings, in which certain embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that, when used in this specification, the terms "comprises" and/or "including" and derivatives thereof, specify the presence of stated features, operations, elements, and/or components, but do not preclude the presence or addition of one or more other features, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions and/or layers, these elements, components, regions and/or layers should not be limited by these terms. These terms are only used to distinguish one element, component, region or layer from another element, component, region or layer. Thus, a first element, component, region or layer discussed below could be termed a second element, component, region or layer without departing from the teachings of the present invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure.

In the drawings and specification, there have been disclosed embodiments of the invention and, although specific terms are employed, they are used in a generic and descriptive sense only and not for purposes of limitation, the scope of the invention being set forth in the following claims.

The invention claimed is:

1. A light emitting device, comprising:
    a light emitting diode (LED) having a light emitting first side surface and a light emitting second side surface defining a corner therebetween, and a light emitting top surface;
    a luminophoric medium layer directly on the light emitting top surface and at least partially covering the corner; and
    a support layer disposed between the corner and the luminophoric medium layer, a perimeter of the support layer comprising a transition area that curves from a position proximate the light emitting first side surface to another position proximate the light emitting second side surface, the transition area separating the luminophoric medium layer from the corner, and wherein the support layer extends at least partially over the light emitting top surface.

2. The light emitting device of claim 1 wherein the support layer extends laterally from the corner.

3. The light emitting device of claim 1 wherein the LED is mounted on a surface and the support layer extends from the corner to the surface such that the transition area is on the surface.

4. The light emitting device of claim 1 wherein the LED is mounted on a supporting surface and the support layer is generally sloped toward the supporting surface.

5. The light emitting device of claim 1 wherein the support layer extends from adjacent the corner and a top surface of the support layer curves away from the LED.

6. The light emitting device of claim 1 wherein the support layer comprises an optical gel.

7. The light emitting device of claim 6 wherein the optical gel comprises silicone.

8. The light emitting device of claim 1 wherein the support layer is transparent.

9. The light emitting device of claim 1 wherein the support layer comprises a top surface that extends from the light emitting first side surface.

10. The light emitting device of claim 9 wherein the top surface of the support layer has a curved shape that asymptotically approaches the light emitting first side surface.

11. The light emitting device of claim 9 wherein the top surface of the support layer is formed of a plurality of curved portions.

12. The light emitting device of claim 9 wherein the top surface of the support layer is at least partially linear.

13. The light emitting device of claim 1 wherein the support layer comprises at least one of an epoxy, a plastic, sapphire, and a glass.

14. The light emitting device of claim 1 wherein the support layer comprises a stand-alone component that has structural integrity.

15. The light emitting device of claim 14 wherein the support layer comprises at least one of a ring and a cap that is separately mounted over the LED.

16. A light emitting device, comprising:
a body;
a light emitting diode (LED) mounted on the body, the LED having a light emitting first surface and a light emitting second surface defining a corner therebetween, and a light emitting top surface;
a support layer disposed to receive light emitted by the light emitting second surface and disposed adjacent the corner, the support layer having a perimeter on the body, the perimeter comprising a transition that curves proximate the corner, and wherein the support layer extends at least partially over the light emitting top surface; and
a luminophoric medium layer at least partially covering the light emitting first surface and the light emitting second surface, the luminophoric medium layer being at least partially supported by the support layer.

17. The light emitting device of claim 16 wherein the support layer comprises a gel.

18. The light emitting device of claim 16 wherein the support layer terminates adjacent the corner and extends away from the LED.

19. The light emitting device of claim 16 wherein the body comprises a cavity and the LED is mounted on a supporting surface within the cavity.

20. The light emitting device of claim 19 further comprising a lens on the cavity.

* * * * *